(12) United States Patent
Kawahara

(10) Patent No.: US 6,497,037 B2
(45) Date of Patent: Dec. 24, 2002

(54) PRODUCTION LINE FOR MOUNTING ELECTRONIC COMPONENTS

(75) Inventor: Toshihiro Kawahara, Kasai (JP)

(73) Assignee: Sanyo Electric Co., Ltd., Osaka (JP)

( * ) Notice: Subject to any disclaimer, the term of this patent is extended or adjusted under 35 U.S.C. 154(b) by 128 days.

(21) Appl. No.: 09/805,882

(22) Filed: Mar. 15, 2001

(65) Prior Publication Data
US 2001/0037187 A1 Nov. 1, 2001

(30) Foreign Application Priority Data

Mar. 17, 2000 (JP) ........................................ 2000-076421

(51) Int. Cl.[7] ................................................. H05K 3/30
(52) U.S. Cl. ............................. 29/832; 29/712; 29/741; 29/742; 29/743
(58) Field of Search ........................ 29/712, 739, 740, 29/741, 742, 743, 755, 832, 833

(56) References Cited

U.S. PATENT DOCUMENTS

| 5,671,527 A | * | 9/1997 | Asai et al. ............. 198/341.05 |
| 6,101,709 A | * | 8/2000 | Shiota ........................ 29/740 |
| 6,427,320 B1 | * | 8/2002 | Seto et al. ..................... 29/739 |

FOREIGN PATENT DOCUMENTS

| JP | 05-167286 | 7/1993 |
| JP | 08-172296 | 7/1996 |

* cited by examiner

*Primary Examiner*—Gregory Huson
*Assistant Examiner*—Peter deVore
(74) *Attorney, Agent, or Firm*—Morrison & Foerster LLP

(57) ABSTRACT

There is provided a production line having a plurality of mounting apparatus of electronic components in which the overall production efficiency is sustained by an alternation scheme when a mounting apparatus has a long cycle time due to a high malfunction rate. At a predetermined timing, the rate of unsuccessful pick-up procedure for an electronic component is compared to a predetermined value. If the rate is higher than the value, CPU finds out if the mounting apparatus 2, or 3 is available as an alternate. When the alternate is the apparatus 2, CPU 10 changes the command parameter of the particular mounting procedure, stored in RAM 12, from "M" to "S", and stops mounting the same component. In the mean time, the mounting apparatus 2 accepts the alternate request from the apparatus 1, changes the command parameter as required, and mounts the same component on a print circuit board.

6 Claims, 7 Drawing Sheets

| step number | X | Y | θ | location number | mounting apparatus | component type | apparatus1 | apparatus2 | apparatus3 |
|---|---|---|---|---|---|---|---|---|---|
| 001 | X1 | Y1 | θ1 | 101 | 1 | RS1005 | 101,201 | 102,202 | 103,203 |
| 002 | X2 | Y2 | θ2 | 111 | 1 | RS1606 | 111,211 | — | 113,213 |
| 003 | X3 | Y3 | θ3 | 122 | 2 | RS2005 | — | 122,222 | 123,223 |
| 004 | X4 | Y4 | θ4 | 132 | 2 | RS3216 | 131,231 | 132,232 | — |
| 005 | X5 | Y5 | θ5 | 141 | 1 | CS1005 | 141,241 | 142,242 | 143,243 |
| 006 | X6 | Y6 | θ6 | 152 | 2 | CS1606 | — | 152,252 | 153,253 |
| 007 | X7 | Y7 | θ7 | 163 | 3 | CS2005 | 161,261 | 162,262 | 163,263 |
| 008 | X8 | Y8 | θ8 | 173 | 3 | CS3216 | — | 172,272 | 173,273 |

Fig. 3

| | step number | X | Y | θ | location number | component type | C |
|---|---|---|---|---|---|---|---|
| mounting apparatus 1 | 001 | X1 | Y1 | θ1 | 101 | RS1005 | M |
| | 002 | X2 | Y2 | θ2 | 111 | RS1606 | M |
| | 003 | X3 | Y3 | θ3 | 122 | RS2005 | S |
| | 004 | X4 | Y4 | θ4 | 132 | RS3216 | S |
| | 005 | X5 | Y5 | θ5 | 141 | CS1005 | M |
| | 006 | X6 | Y6 | θ6 | 152 | CS1606 | S |
| | 007 | X7 | Y7 | θ7 | 163 | CS2005 | S |
| | 008 | X8 | Y8 | θ8 | 173 | CS3216 | S |
| | step number | X | Y | θ | location number | component type | C |
| mounting apparatus 2 | 001 | X1 | Y1 | θ1 | 101 | RS1005 | S |
| | 002 | X2 | Y2 | θ2 | 111 | RS1606 | S |
| | 003 | X3 | Y3 | θ3 | 122 | RS2005 | M |
| | 004 | X4 | Y4 | θ4 | 132 | RS3216 | M |
| | 005 | X5 | Y5 | θ5 | 141 | CS1005 | S |
| | 006 | X6 | Y6 | θ6 | 152 | CS1606 | M |
| | 007 | X7 | Y7 | θ7 | 163 | CS2005 | S |
| | 008 | X8 | Y8 | θ8 | 173 | CS3216 | S |
| | step number | X | Y | θ | location number | component type | C |
| mounting apparatus 3 | 001 | X1 | Y1 | θ1 | 101 | RS1005 | S |
| | 002 | X2 | Y2 | θ2 | 111 | RS1606 | S |
| | 003 | X3 | Y3 | θ3 | 122 | RS2005 | S |
| | 004 | X4 | Y4 | θ4 | 132 | RS3216 | S |
| | 005 | X5 | Y5 | θ5 | 141 | CS1005 | S |
| | 006 | X6 | Y6 | θ6 | 152 | CS1606 | S |
| | 007 | X7 | Y7 | θ7 | 163 | CS2005 | M |
| | 008 | X8 | Y8 | θ8 | 173 | CS3216 | M |

Fig. 4

| apparatus 1 | step number | X | Y | θ | location number | component type | C |
|---|---|---|---|---|---|---|---|
| | 001 | X1 | Y1 | θ1 | 101 | RS1005 | M |
| | 002 | X2 | Y2 | θ2 | 111 | RS1606 | M |
| | 003 | X5 | Y5 | θ5 | 141 | CS1005 | M |

| apparatus 2 | step number | X | Y | θ | location number | component type | C |
|---|---|---|---|---|---|---|---|
| | 001 | X3 | Y3 | θ3 | 122 | RS2005 | M |
| | 002 | X4 | Y4 | θ4 | 132 | RS3216 | M |
| | 003 | X6 | Y6 | θ6 | 152 | CS1606 | M |

| apparatus 3 | step number | X | Y | θ | location number | component type | C |
|---|---|---|---|---|---|---|---|
| | 001 | X7 | Y7 | θ7 | 163 | CS2005 | M |
| | 002 | X8 | Y8 | θ8 | 173 | CS3216 | M |

Fig. 5

| | location number | number of total pick-up procedure | number of unsuccessful pick-up procedure | rate of unsuccessful pick-up procudure |
|---|---|---|---|---|
| mounting apparatus 1 | 101 | A | K | K/A × 100 |
| | 102 | B | L | L/B × 100 |
| | 103 | C | M | M/C × 100 |
| | ... | ... | ... | ... |
| | ... | ... | ... | ... |
| | ... | ... | ... | ... |
| | ... | ... | ... | ... |
| | ... | ... | ... | ... |

| | location number | number of total pick-up procedure | number of unsuccessful pick-up procedure | rate of unsuccessful pick-up procudure |
|---|---|---|---|---|
| mounting apparatus 2 | 101 | D | N | N/D × 100 |
| | 102 | E | O | O/E × 100 |
| | 103 | F | P | P/F × 100 |
| | ... | ... | ... | ... |
| | ... | ... | ... | ... |
| | ... | ... | ... | ... |
| | ... | ... | ... | ... |
| | ... | ... | ... | ... |

| | location number | number of total pick-up procedure | number of unsuccessful pick-up procedure | rate of unsuccessful pick-up procudure |
|---|---|---|---|---|
| mounting apparatus 3 | 101 | G | Q | Q/G × 100 |
| | 102 | H | R | R/H × 100 |
| | 103 | I | S | S/I × 100 |
| | ... | ... | ... | ... |
| | ... | ... | ... | ... |
| | ... | ... | ... | ... |
| | ... | ... | ... | ... |
| | ... | ... | ... | ... |

Fig. 6

PRODUCTION LINE FOR MOUNTING ELECTRONIC COMPONENTS

BACK GROUND OF THE INVENTION

1. Field of the Invention

The present invention relates to an apparatus and a method for mounting electronic components utilizing a plurality of mounting apparatus of electronic components, which have a plurality of component feeding units, and a component mounting unit for receiving electronic components from the feeding units and for mounting electronic components on a print circuit board.

2. Prior Art

Mounting apparatus of electronic components having an alternate capability are described in publications including Japanese patent laid-open publications No. Hei 5-167286 and No. Hei 8-172296. Such alternate capability is to alternate means for supplying electronic components and includes such alternate schemes as cassette-alternate, stage-alternate, and tray-alternate. These alternate schemes are, however, confined to a single mounting apparatus of electronic components.

Recently, there has been an increasing need for a production line for mounting electronic components where a plurality of mounting apparatus are simultaneously used, as the variety of the electronic components to be mounted has been increased.

In this type of multiple mounting-apparatus production line, there can be unpredicted imbalance of workload among the mounting apparatus due to the difference in their malfunction rates even when the original workload distribution is carefully designed among the mounting apparatus. This results in a lower throughput (number of print circuit boards through the mounting process per unit time) of the production line as a whole.

SUMMARY OF THE INVENTION

The present invention involves a production line for mounting electronic components having a plurality of mounting apparatus in which a mounting apparatus assumes a responsibility of another mounting apparatus for improving the overall production efficiency of the production line when the latter mounting apparatus has a longer cycle time than originally planned due to a higher malfunction rate of one of its component feeding units for supplying an electronic component, and when the former mounting apparatus can mount the same electronic component which is planned to be mounted by the latter mounting apparatus.

In the present invention, there is provided an apparatus as well as a method utilizing a plurality of mounting apparatus of electronic components, which have a plurality of component feeding units, and a component mounting unit for receiving electronic components from the feeding units and for mounting electronic components on a print circuit board. The apparatus has a memory means for recording a malfunction rate for each of its feeding units, and a computation means for comparing the malfunction rate to a predetermined value at a predetermined time for evaluating the malfunction rate. When the malfunction rate is higher than the value for a component feeding unit of a mounting apparatus, a selection means of the apparatus tries to choose an alternate component feeding unit on a different mounting apparatus, which supplies the same electronic component as the unit having a higher malfunction rate than the predetermined value. When there is such an alternate component feeding unit available, a control means of the apparatus has the alternate component feeding unit supplying the electronic component for mounting on the print circuit board, and has the component feeding unit with the malfunction rate higher than the predetermined value discontinuing supplying the electronic component.

In one embodiment of the present invention, the memory means records the numbers both for total and unsuccessful pick-up procedures for each of the component feeding units of all the mounting apparatus in the production line, and the malfunction rate is calculated from the two numbers at a predetermined time for evaluating the malfunction rates.

The configuration described above is able to prevent, utilizing the alternation scheme, the production line for mounting electronic components from having a lower production efficiency than expected even when one of the mounting apparatus has a longer cycle time due to a higher malfunction rate of its component feeding unit.

BRIEF DESCRIPTION OF THE DRAWINGS

The present invention may be better understood, and its objectives, features, and advantages may be made apparent to those skilled in the art, by referring to the accompanying drawings.

FIG. 3 shows a portion of the master data for all the mounting procedures performed at the mounting apparatus 1, 2, and 3.

FIG. 4 shows three sets of mounting data stored in the RAM of each of the three mounting apparatus with an all-data distribution scheme.

FIG. 5 shows three sets of mounting data stored in the RAM of each of the three mounting apparatus with a minimal-data distribution scheme.

FIG. 6 shows three sets of data on the pick-up procedures stored in the RAM of each of the three mounting apparatus.

DETAILED DESCRIPTION OF THE INVENTION

Figure 1:
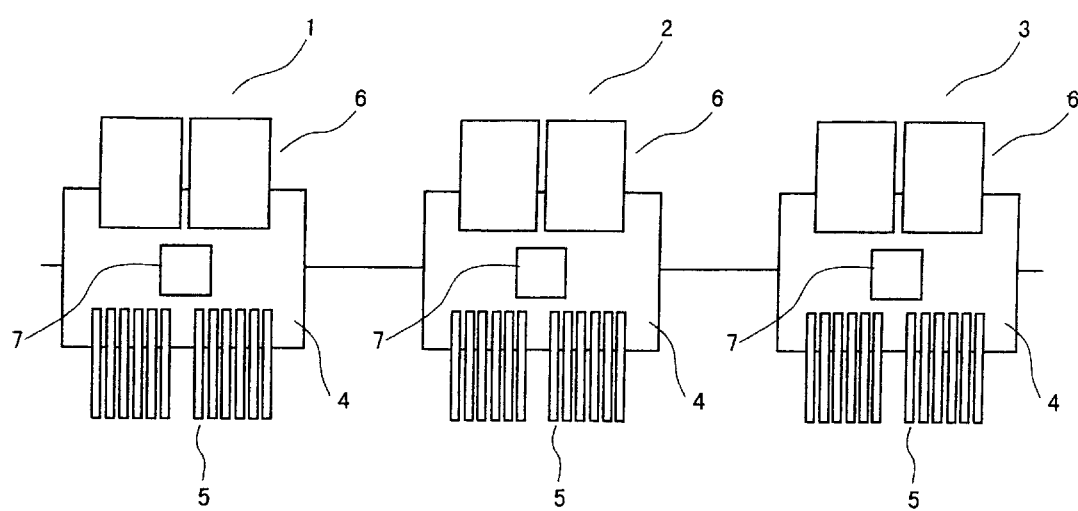
FIG. 1 is a conceptual plan view showing a portion of a production line for mounting electronic components as an embodiment of the present invention.

A few embodiments of the present invention will be described hereinafter by referring to the aforementioned figures. FIG. 1 is a conceptual plan view of a production line for mounting electronic components as an embodiment of the present invention, in which three mounting apparatus 1, 2, 3 are simultaneously used. There are provided on the base 4 of each mounting apparatus a plurality of component feeding devices 5 and a plurality of component feeding trays 6, which supply various types of electronic components, one electronic component being supplied at one mounting procedure, to a pick-up position where the electronic components are picked up by a suction nozzle of a mounting unit. Each of the component feeding devices 5 and component feeding trays 6 serves as a component feeding unit.

Between the group of the component feeding devices 5 and the group of the component feeding trays 6, which face to each other, there are provided an incoming conveyer, a portion for positioning, and an outgoing conveyer, all of which are not shown in the figure. The incoming conveyer receives a print circuit board from an upstream process and transports the print circuit board to the portion for positioning where the print circuit board is positioned for the mounting procedures by a positioning means not shown in the figure. After all the mounting procedures are completed, the outgoing conveyer receives the print circuit board from the portion for positioning, and transports the print circuit board to a downstream process.

A mounting unit 7 has a plurality of suction nozzles for picking up electronic components and mounting them on the print circuit board, and is capable of moving in the X and Y directions by, for example, an X-axis motor and a Y-axis motor, respectively. Furthermore, each mounting unit 7 has a vertical motor for vertically moving the suction nozzles and a θ-axis motor for rotating the suction nozzles around a vertical axis. This configuration enables the movements of the suction nozzles of the mounting unit 7 in the X and Y directions as well as the vertical direction, and the vertical rotation of the suction nozzles of the mounting unit 7.

Furthermore, there is on the base 4 provided a camera, not shown in the figure, for observing the position of the electronic component picked up by the suction nozzle, the shift of the suction nozzle relative to the electronic component from a proper position is estimated on the X and Y directions and the rotation based on the results of the position observation by the camera. The estimated shift is corrected using the X-axis, Y-axis, and θ-axis motors when the electronic component held by the suction nozzle is mounted on the print circuit board.

Figure 2:
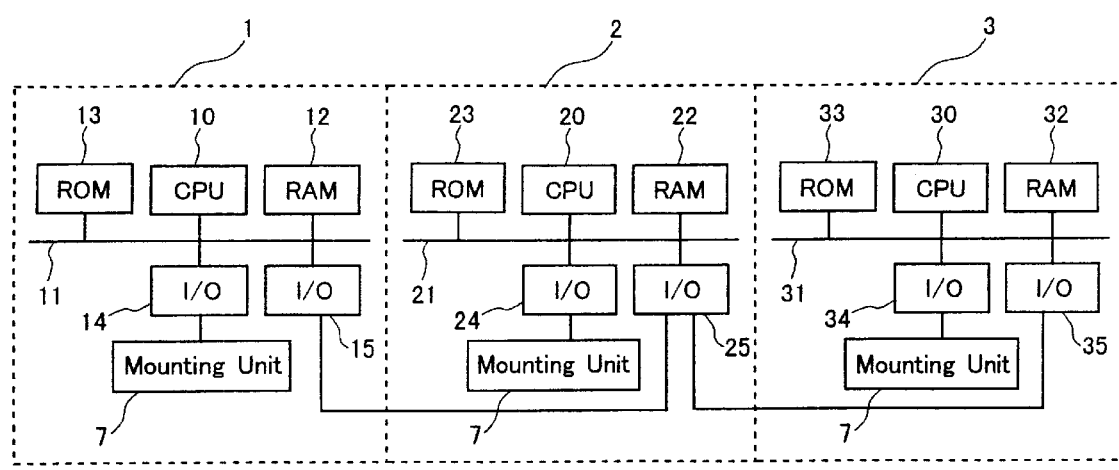
FIG. 2 is a block diagram showing a portion of a control scheme of the production line for mounting electronic components.

FIG. 2 is a block diagram showing a portion of a control scheme of the production line for mounting electronic components having the mounting apparatus 1, 2, 3. Three mounting apparatus 1, 2, 3 have CPU 10, 20, 30, respectively, for controlling their mounting procedures. Three CPU, 10, 20, 30 are connected to RAM (Random Access Memory) 12, 22, 32, and ROM (Read Only Memory) 13, 23, 33, respectively, through bus lines 11, 21, 31. The CPU 10, 20, 30 control the mounting procedures of the electronic components by the mounting apparatus 1, 2, 3 using data stored in the RAM 12, 22, 32 and programs stored in the ROM 13, 23, 33.

Within the mounting apparatus 1, 2, 3, the mounting unit 7 is controlled by the CPU 10, 20, 30 through interfaces 14, 24, 34, respectively, and the three mounting apparatus are interconnected through interfaces 15, 25, 35.

The RAM 12 stores the master data for all the mounting procedures performed by the mounting apparatus 1, 2, 3. The master data includes, as shown in FIG. 3, for each step (denoted as step number in the figure) of the mounting procedures, the X and Y coordinates (shown by X and Y in the figure) of mounting position within the plane of the print circuit board, the rotation (θ) of mounting, the location number indicating the location of a specific electronic component within a component feeding device 5 or component feeding tray 6 in a mounting apparatus, the mounting apparatus to be used, the type of the electronic component to be mounted, and the location number of the mounting apparatus which can be alternated According to the master data shown in FIG. 3, in the first mounting procedure (step number 1), the mounting apparatus 1 picks up an electronic component, RS1005, from a location denoted by a location number, 101, and mounts RS1005 on a print circuit board at a position defined by the X and Y coordinates, X1, Y1 and the rotation angle, θ1.

As shown in FIG. 6, RAM 12 22, 32 store the data for the numbers of total and unsuccessful pick-up procedures and the rate of unsuccessful pick-up procedure for each of the location numbers of the mounting apparatus. After each mounting procedure, the data specific to the mounting procedure is renewed and recorded in the RAM 12, 22, 32. Unsuccessful pick-ups include a missing electronic component from the suction nozzle, a "standing" electronic component (the face held by the nozzle is not a correct face of the component), a leak in the vacuum for suction detected by a vacuum sensor, an incorrect component positioning detected by the observation camera, a loose lead found by the observation camera, and an incorrect component thickness detected by the observation camera. The rate of unsuccessful pick-up procedure is expressed in % by dividing the number of unsuccessful pick-up procedures by the number of total pick-up procedures and multiplying by 100, as shown in the figure.

At a predetermined time for evaluating the rate of unsuccessful pick-up procedure, each CPU 10, 20, 30 compares such rates of its mounting apparatus to corresponding predetermined values. Such predetermined times for the evaluation include a time when the number of unsuccessful pick-up procedures reaches a predetermined number, a time when the number of discontinuing the mounting procedure reaches a predetermined number, and a time when the total number pick-up procedures reaches a predetermined number. If a rate of unsuccessful pick-up procedure for an electronic component is larger than the predetermined value, the CPU chooses a mounting apparatus which is capable of mounting the same electronic component as the one with the higher rate when such a mounting apparatus is available. After the selection of the alternate mounting apparatus, the CPU changes, as described in more detail later, the master data for mounting procedures such that the alternate mounting apparatus picks up the same electronic component from the component feeding device 5 or the component feeding tray, which stores the same component, and mounts the component on the print circuit board.

The alternate mounting apparatus can be the one in the upstream or the one in the down stream of the production line. If the mounting apparatus requesting the alternate is the one in the most upstream, the mounting apparatus 1, and the alternate mounting apparatus is the one in the middle, the mounting apparatus 2, CPU 10 asks CPU 20 for the alternate, and the electronic component needing the alternate is mounted by the mounting apparatus 2 after the print circuit board with all other components being mounted by the mounting apparatus 1 is sent to the mounting apparatus 2. Conversely, if the mounting apparatus requesting the alternate is the one in the most downstream, the mounting apparatus 3, and the alternate mounting apparatus is the one in the middle, the mounting apparatus 2, CPU 30 asks CPU 20 for the alternate, and the electronic component needing the alternate is mounted by the mounting apparatus 20 before the print circuit board is sent to the mounting apparatus 3. It is also possible that a mounting apparatus needing an alternate finds an alternate component feeding device 5, or component feeding tray 6 within itself.

The predetermined vales to be compared with the rates of unsuccessful pick-up procedure are stored only in RAM 12. However, these values can be stored in each of three RAM 12, 22, 32. Furthermore, although the rates of unsuccessful pick-up procedure are calculated and recorded in RAM 12, 22, 32 after each mounting procedure in this embodiment, the rates are calculated from the number of total mounting procedures and the number of unsuccessful mounting procedures stored in RAM 12, 22, 32, by the corresponding CPU 10, 20, 30 only at the predetermined time for the evaluation in other embodiment.

Referring to the first row of the FIG. 3, the three columns from the right, designated as apparatus 1, 2, and 3 in the figure, contain the data for the alternate for the component type, RS1005. If the rate of unsuccessful pick-up procedure on the component feeding device 5 denoted by the location number 101 of the mounting apparatus 1 is higher than the predetermined value, the first choice for the alternate is the component feeding device 5 denoted by the location number 201 of the mounting apparatus 1. If it is found that the component feeding device 5 denoted by the location number 201 has the rate higher than the predetermined value, next choice for the alternate is the component feeding device 5 denoted by the location number 102 of the mounting apparatus 2. Accordingly, the preferences of other choices of the alternate are determined based on the data shown in the figure.

Furthermore, CPU 10 distributes subsets of the master data for mounting procedures stored in RAM 12 to the three mounting apparatus 1, 2, 3 taking the workload distribution into consideration, and has the data stored in RAM 12, 22, 32. The subsets of the master data can include all the data needed for the mounting procedures of the three mounting apparatus, as shown in FIG. 4, or be limited to only the portion of the data needed for the mounting procedures of one mounting apparatus, as shown in FIG. 5.

Now, the operation of the apparatus having the configuration described above will be explained hereinafter.

Figure 7:
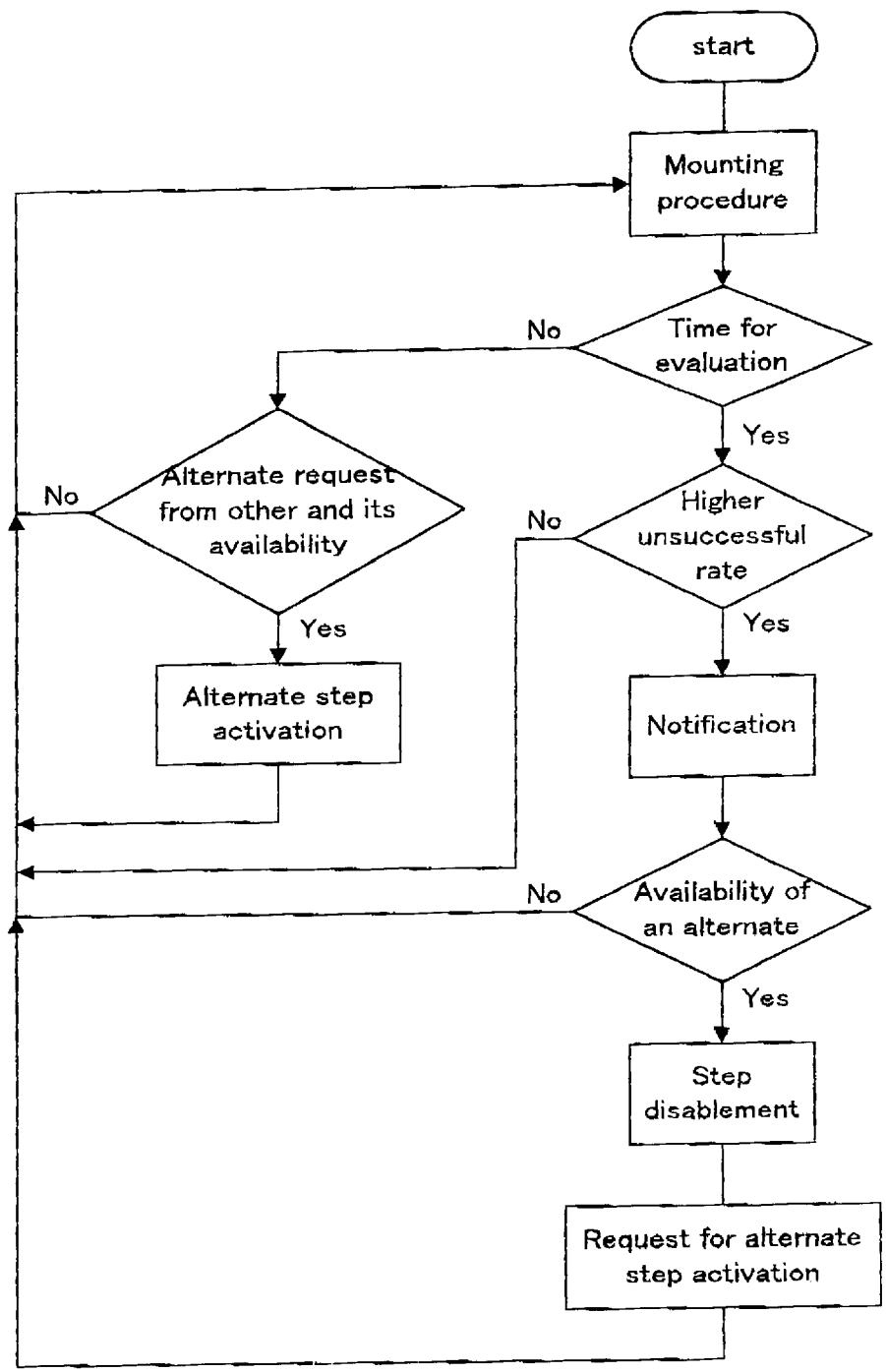
FIG. 7 shows a flowchart of the mounting operation of the mounting apparatus 1.

First, the three mounting apparatus 1, 2, 3 start mounting procedures of the electronic components guided by the operation programs stored in ROM 13, 23, 33. The incoming conveyer receives a print circuit board from an upstream process and transports the print circuit board to the portion for positioning where the print circuit board is positioned for the mounting procedures by a positioning means. For the sake of better understanding, the description hereinafter will be confined to the mounting procedures of the mounting apparatus 1 by referring to FIG. 4, FIG. 6 and FIG. 7.

At the beginning of the mounting procedure by the mounting apparatus 1, CPU 10 finds out if it is the time for evaluating the rate of unsuccessful pick-up procedure. If it is not the time for the evaluation, CPU 10 looks for a request for the alternate from either CPU 20, or CPU 30. Then, if there is such a request, CPU 10 looks for a possible alternate within the mounting apparatus 1. When there is not a request for the alternate, or when there is such a request but there is not any alternate available, CPU 10 carries on the mounting procedures of the mounting apparatus 1 as specified by the original master data. The mounting apparatus 1 picks up the electronic component, RS1005, from the component feeding device 5 denoted by the location number 101, detects the shift of the component from the proper position in the X and Y directions and the rotation around the vertical axis using the observation camera, corrects the shift using the X-axis, Y-axis, and θ motors, and mounts the electronic component on the print circuit board. This mounting procedure continues until CPU receives an alternate request which can be satisfied or CPU finds out that it is the time for the evaluation.

When CPU 10 receives an alternate request from CPU 20 or CPU 30 and finds an available alternate within the apparatus 1, CPU 10 carries out the following procedure to activate a step for mounting the electronic component needing the alternate. In the data for mounting procedures of the mounting apparatus 1 stored in RAM 12, as shown in FIG. 4, the column C contains the command parameters for activating each step, or mounting procedure, of the mounting apparatus. When the parameter "S" is recorded in the column for a step, the mounting procedure corresponding to the step is not performed by the mounting apparatus 1. Likewise, when the parameter "M" is recorded in the column for a step, the mounting procedure corresponding to the step is performed by the mounting apparatus 1. CPU 10, now, changes the parameter of the step from "S" to "M" in the data stored in RAM 12 to activate the step. Based on the revised data for mounting procedures, the mounting apparatus 1 performs an additional mounting procedure for mounting the electronic component needing the alternate before the print circuit board is transported downstream. This additional mounting procedure can be performed at the end of all the originally scheduled mounting procedures, or in between those mounting procedures.

When CPU 10 finds out, based on the data stored in RAM 12, that it is the predetermined time for evaluating the rate of unsuccessful pick-up procedure, CPU 10 compares the rate to the predetermined value. Such predetermined times for the evaluation include a time when the number of unsuccessful pick-up procedures reaches a predetermined number, a time when the number of discontinuing the mounting procedure reaches a predetermined number, and a time when the total number pick-up procedures reaches a predetermined number.

When the rate is not higher than the predetermined value, the CPU 10 carries on the mounting procedures based on the original data for mounting apparatus 1. When the rate is higher than the predetermined value, CPU 10 informs the operator of the event, and finds out if the mounting apparatus 2 or 3 is available as the alternate (CPU can also search the mounting apparatus 1 if it has another component feeding device 5, or tray 6 for the same component). The mounting operation resumes if there is not any alternate available. And when an alternate is available, CPU 10 changes the command parameter of the step for mounting the electronic component needing the alternate from "M" to "S", and thus stops the mounting procedure of the electronic component.

In the mean time, if the alternate is the mounting apparatus 2 having a component feeding device 5 or component feeding tray 6, which contains the electronic component needing the alternate, CPU 10 sends an alternate request to CPU 20. Then, CPU 20 changes the command parameter of the step of the mounting the electronic component from "S" to "M" in the data stored in RAM 22 to activate the step. Based on the revised data for mounting procedures, the mounting apparatus 2 performs an additional mounting procedure for mounting the electronic component which is not mounted on the print circuit board by the mounting apparatus 1. This additional mounting procedure can be performed at the start or the end of all the originally scheduled mounting procedures, or in between those mounting procedures.

In the aforementioned embodiments, each mounting apparatus has its CPU, RAM and ROM locally equipped. However, it is also possible that only one such set is provided for controlling all the mounting apparatus in the production line. This is one of many modifications of the present invention within the scope thereof.

While the invention has been described and illustrated with respect to a few embodiments, it will be understood by those skilled in the art that various other changes and modifications may be made without departing from the spirit and scope of the invention. All such modifications are intended for inclusion within the scope of the following claims.

What is claimed is:

1. An apparatus having a plurality of mounting apparatus of electronic components, said mounting apparatus having a plurality of component feeding units, and a component mounting unit for receiving electronic components from the feeding units and for mounting electronic components on a print circuit board, the apparatus comprising:
   a memory means for recording a malfunction rate for each of the feeding units of the mounting apparatus;
   a computation means for comparing the malfunction rate to a predetermined value at a predetermined time for evaluating the malfunction rate;
   a selection means for choosing an alternate component feeding unit on one of said plurality of mounting apparatus, the alternate feeding unit supplying a same electronic component as a unit having a higher malfunction rate than the predetermined value; and
   a control means for having the alternate component feeding unit supplying the electronic component for mounting on the print circuit board, and for having the component feeding unit with the malfunction rate higher than the predetermined value discontinuing supplying the electronic component.

2. An apparatus according to claim 1, wherein said malfunction rate is calculated from a number of total pick-up procedures of an electronic component and a number of unsuccessful pick-up procedures of the electronic component.

3. An apparatus having a plurality of mounting apparatus of electronic components, said mounting apparatus having a plurality of component feeding units, and a component mounting unit for receiving electronic components from the feeding units and for mounting electronic components on a print circuit board, the apparatus comprising:
   a memory means for recording a number of total pick-up procedures of an electronic component and a number of unsuccessful pick-up procedures of the electronic component for each of the feeding units of the mounting apparatus;
   a computation means for calculating a malfunction rate from the number of total pick-up procedures and the number of unsuccessful pick-up procedures and for comparing the malfunction rate to a predetermined value at a predetermined time for evaluating the malfunction rate;
   a selection means for choosing an alternate component feeding unit on one of said plurality of mounting apparatus, the alternate feeding unit supplying a same electronic component as a unit having a higher malfunction rate than the predetermined value; and
   a control means for having the alternate component feeding unit supplying the electronic component for mounting on the print circuit board, and for having the component feeding unit with the malfunction rate higher than the predetermined value discontinuing supplying the electronic component.

4. A method of mounting electronic components with a plurality of mounting apparatus of electronic components, said mounting apparatus having a plurality of component feeding units, and a component mounting unit for receiving electronic components from the feeding units and for mounting electronic components on a print circuit board, the method comprising:
   recording a malfunction rate for each of the feeding units of the mounting apparatus;
   comparing the malfunction rate to a predetermined value at a predetermined time for evaluating the malfunction rate;
   choosing an alternate component feeding unit on one of said plurality of mounting apparatus, the alternate feeding unit supplying a same electronic component as a unit having a higher malfunction rate than the predetermined value;
   having the alternate component feeding unit supplying the electronic component for mounting on the print circuit board;
   having the component feeding unit with the malfunction rate higher than the predetermined value discontinuing supplying the electronic component;
   wherein an upstream mounting apparatus mounts the electronic component which is to be mounted by an downstream mounting apparatus when the component feeding unit of the downstream mounting apparatus has the malfunction rate higher than the predetermined value, said print circuit board being transported from the upstream mounting apparatus toward the downstream mounting apparatus after the electronic component and all the electronic components to be mounted in the upstream mounting apparatus are mounted on the print circuit board in the upstream mounting apparatus; and
   wherein a downstream mounting apparatus mounts the electronic component which is to be mounted by an upstream mounting apparatus when the component feeding unit of the upstream mounting apparatus has the malfunction rate higher than the predetermined value, said print circuit board being transported from the upstream mounting apparatus toward the downstream mounting apparatus after all the other electronic components to be mounted in the upstream mounting apparatus are mounted on the print circuit board in the upstream mounting apparatus.

5. A method of mounting electronic components according to claim 4, wherein said malfunction rate is calculated from a number of total pick-up procedures of an electronic component and a number of unsuccessful pick-up procedures of the electronic component.

6. A method of mounting electronic components with a plurality of mounting apparatus of electronic components, said mounting apparatus having a plurality of component feeding units, and a component mounting unit for receiving electronic components from the feeding units and for mounting electronic components on a print circuit board, the method comprising:
   recording a number of total pick-up procedures of an electronic component and a number of unsuccessful pick-up procedures of the electronic component for each of the feeding units of the mounting apparatus;
   calculating a malfunction rate from the number of total pick-up procedures and the number of unsuccessful pick-up procedures at a predetermined time for evaluating the malfunction rate;
   comparing the malfunction rate to a predetermined value;
   choosing an alternate component feeding unit on one of said plurality of mounting apparatus, the alternate feeding unit supplying a same electronic component as a unit having a higher malfunction rate than the predetermined value;

having the alternate component feeding unit supplying the electronic component for mounting on the print circuit board;

having the component feeding unit with the malfunction rate higher than the predetermined value discontinuing supplying the electronic component;

wherein an upstream mounting apparatus mounts the electronic component which is to be mounted by an downstream mounting apparatus when the component feeding unit of the downstream mounting apparatus has the malfunction rate higher than the predetermined value, said print circuit board being transported from the upstream mounting apparatus toward the downstream mounting apparatus after the electronic component and all the electronic components to be mounted in the upstream mounting apparatus are mounted on the print circuit board in the upstream mounting apparatus; and wherein a downstream mounting apparatus mounts the electronic component which is to be mounted by an upstream mounting apparatus when the component feeding unit of the upstream mounting apparatus has the malfunction rate higher than the predetermined value, said print circuit board being transported from the upstream mounting apparatus toward the downstream mounting apparatus after all the other electronic components to be mounted in the upstream mounting apparatus are mounted on the print circuit board in the upstream mounting apparatus.

* * * * *